(12) United States Patent
Pellizzer et al.

(10) Patent No.: US 8,546,231 B2
(45) Date of Patent: Oct. 1, 2013

(54) MEMORY ARRAYS AND METHODS OF FORMING MEMORY CELLS

(75) Inventors: Fabio Pellizzer, Cornate D'Adda (IT); Roberto Bez, Milan (IT); Lorenzo Fratin, Buccinasco (IT)

(73) Assignee: Micron Technology, Inc., Boise, ID (US)

( * ) Notice: Subject to any disclaimer, the term of this patent is extended or adjusted under 35 U.S.C. 154(b) by 79 days.

(21) Appl. No.: 13/298,962

(22) Filed: Nov. 17, 2011

(65) Prior Publication Data
US 2013/0126822 A1     May 23, 2013

(51) Int. Cl.
*G11C 17/16*     (2006.01)

(52) U.S. Cl.
USPC ............ 438/381; 257/4; 257/E45.002

(58) Field of Classification Search
USPC ............ 257/4, E21.158, E45.002; 438/381, 438/570
See application file for complete search history.

(56) References Cited

U.S. PATENT DOCUMENTS

| | | | |
|---|---|---|---|
| 6,611,453 B2 | 8/2003 | Ning | |
| 6,692,898 B2 | 2/2004 | Ning | |
| 7,169,624 B2 | 1/2007 | Hsu | |
| 7,838,341 B2 | 11/2010 | Dennison | |
| 7,888,711 B2 | 2/2011 | Cheung et al. | |
| 7,919,766 B2 | 4/2011 | Lung | |
| 2006/0157682 A1* | 7/2006 | Scheuerlein | 257/4 |
| 2010/0054029 A1* | 3/2010 | Happ et al. | 365/163 |
| 2010/0301303 A1 | 12/2010 | Wang et al. | |
| 2010/0323490 A1 | 12/2010 | Sreenivasan et al. | |
| 2011/0001114 A1 | 1/2011 | Zanderighi et al. | |
| 2011/0155984 A1 | 6/2011 | Redaelli et al. | |
| 2011/0193042 A1* | 8/2011 | Maxwell | 257/1 |

OTHER PUBLICATIONS

Happ et al., "Novel One-Mask Self-Heating Pillar Phase Change Memory", IEEE, 2006 Sumposium on VLSI Technology Digest of Technical Papers.
U.S. Appl. No. 13/298,840, filed Nov. 17, 2011 by Tang et al.

* cited by examiner

*Primary Examiner* — Thomas L Dickey
(74) *Attorney, Agent, or Firm* — Wells St. John P.S.

(57) ABSTRACT

Some embodiments include methods of forming memory cells. A stack includes ovonic material over an electrically conductive region. The stack is patterned into rails that extend along a first direction. The rails are patterned into pillars. Electrically conductive lines are formed over the ovonic material. The electrically conductive lines extend along a second direction that intersects the first direction. The electrically conductive lines interconnect the pillars along the second direction. Some embodiments include a memory array having first electrically conductive lines extending along a first direction. The lines contain n-type doped regions of semiconductor material. Pillars are over the first conductive lines and contain mesas of the n-type doped regions together with p-type doped regions and ovonic material. Second electrically conductive lines are over the ovonic material and extend along a second direction that intersects the first direction. The second electrically conductive lines interconnect the pillars along the second direction.

31 Claims, 8 Drawing Sheets

MEMORY ARRAYS AND METHODS OF FORMING MEMORY CELLS

TECHNICAL FIELD

Memory arrays and methods of forming memory cells.

BACKGROUND

Memory is one type of integrated circuitry, and is used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

One type of memory is phase change random access memory (PCRAM). Such memory utilizes phase change material as a programmable material. Example phase change materials that may be utilized in PCRAM are ovonic materials, such as various chalcogenides.

The phase change materials reversibly transform from one phase to another through application of appropriate electrical stimulus. Each phase may be utilized as a memory state, and thus an individual PCRAM cell may have two selectable memory states that correspond to two inducible phases of the phase change material.

A difficulty in utilizing PCRAM is that there can be substantial leakage of current through the memory cells, and such may adversely lead to errors during retrieval of stored data from a memory device. Accordingly, diodes or other select devices are commonly paired with the memory cells to assist in control of current through the memory cells.

Various problems can be encountered in the development of memory array architectures comprising PCRAM cells and select devices. The problems can involve, for example, mask misalignment during the various patterning steps utilized to pattern the memory cells and/or to pattern the select devices.

It would be desirable to develop methods of forming PCRAM cell memory array architectures in which multiple structures of the memory cells and/or associated select devices are fabricated with a common masking step, in that such can reduce masking steps and thereby reduce likelihood of mask misalignment. It would also be desirable to develop improved PCRAM cell architectures.

DETAILED DESCRIPTION OF THE ILLUSTRATED EMBODIMENTS

Some embodiments comprise methods of forming PCRAM in which ovonic material is patterned simultaneously with conductive material to form rails. The conductive material within such rails is subsequently incorporated into access/sense lines (for instance, wordlines), and the ovonic material is subsequently incorporated into PCRAM cells. Some embodiments comprise memory arrays containing n-type doped regions of semiconductor material that form electrically conductive lines extending along a first direction. P-type doped regions may be over the n-type doped regions, and within pillars extending upwardly from the n-type doped regions. Ovonic material may be over the p-type doped regions, and may be incorporated within PCRAM cells.

Example embodiments are described with reference to FIGS. 1-22. Symbols are utilized in various of the figures to indicate dopant levels. Specifically, some or all of the designations p+, p, p−, n−, n and n+ may be used to indicate various levels and types of doping. The difference in dopant concentration between the regions identified as being p+, p, and p− may vary depending on the particular material being doped. An example dopant concentration of a p+ region in monocrystalline silicon is a dopant concentration of at least about $10^{19}$ atoms/cm$^3$ (and in some example applications may be from about $10^{19}$ atoms/cm$^3$ to about $10^{20}$ atoms/cm$^3$), an example dopant concentration of a p region is from about $10^{18}$ to about $10^{19}$ atoms/cm$^3$, and an example dopant concentration of a p− region is less than about $5\times10^{18}$ atoms/cm$^3$. The regions identified as being n−, n and n+ may have dopant concentrations similar to those described above relative to the p−, p and p+ regions, respectively.

It is noted that the terms "p" and "n" can be utilized herein to refer to both dopant type and relative dopant concentrations. The terms "p" and "n" are to be understood as referring only to dopant type, and not to a relative dopant concentration, except when it is explicitly stated that the terms refer to relative dopant concentrations. Accordingly, for purposes of interpreting this disclosure and the claims that follow, it is to be understood that the terms "p-type doped" and "n-type doped" refer to dopant types of regions and not to relative dopant levels. Thus, a p-type doped region can be doped to any of the p+, p, and p− dopant levels discussed above, and similarly an n-type doped region can be doped to any of the n+, n, and n− dopant levels discussed above.

Figure 1:
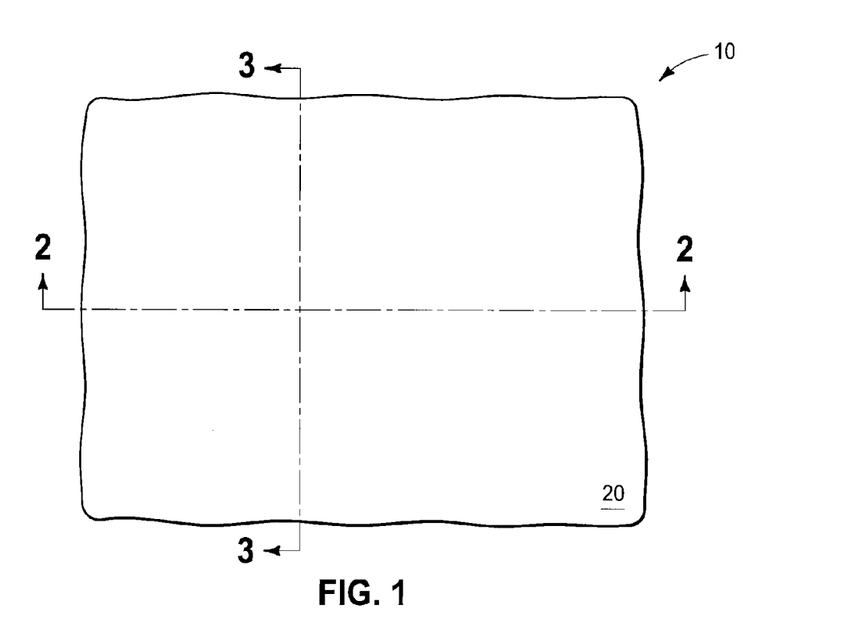
FIGS. 1-3 show a top view (FIG. 1) and cross-sectional side views (FIGS. 2 and 3) of a portion of a construction at a processing stage of an example embodiment method of forming memory cells. The cross-section of FIG. 2 is along the lines 2-2 of FIGS. 1 and 3, and the cross-section of FIG. 3 is along the lines 3-3 of FIGS. 1 and 2.
Figure 2:
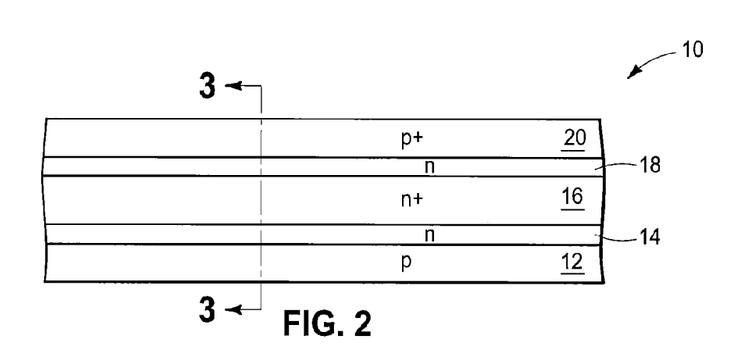
Figure 3:
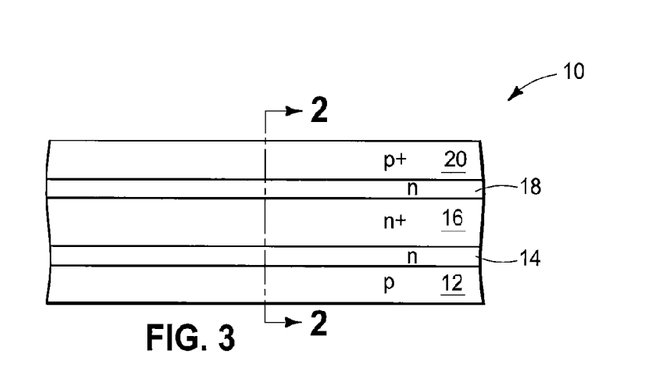

Referring to FIGS. 1-3, a construction 10 is shown to comprise a p-type doped region 12, n-type doped regions 14, 16 and 18 over region 12, and a p-type doped region 20 over region 18.

The region 12 may be comprised by a semiconductor base, such as, for example, a monocrystalline silicon wafer. The semiconductor base may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

In some embodiments, the p-type doped region 12 may be a collector region of a bipolar transistor. In some embodiments, the region 12 may be part of a semiconductor base containing one or more structures associated with integrated circuit fabrication. For instance, the base may comprise CMOS and/or other logic circuitry. Such logic circuitry may be configured for controlling current flow during programming and/or reading of memory cells of a memory array ultimately formed over the region 12 (with a portion of an example memory array being shown in FIGS. 19-21).

The region 12 may be formed by implanting p-type dopant into a monocrystalline silicon substrate.

Regions 14, 16, 18 and 20 may be formed with any suitable processing. For instance, in some embodiments all of the regions 12, 14, 16, 18 and 20 may be formed by implanting appropriate dopants into a semiconductor substrate (for instance, a substrate comprising, consisting essentially of, or consisting of monocrystalline silicon). In other embodiments, one or more of the regions 14, 16, 18 and 20 may be formed by epitaxial growth and in situ doping of semiconductor material (for instance, monocrystalline silicon) over an underlying semiconductor substrate. The utilization of epitaxial-growth technologies may enable thicknesses of layers 14, 16, 18 and 20 to be relatively tightly controlled. If regions 14, 16, 18 and 20 are formed by epitaxial growth, the regions may comprise identical semiconductor material as one another in some embodiments; and in other embodiments one or more of the regions may comprise different semiconductor material relative to one another.

The region 16 is shown to be doped to an n+ level, and thus is shown to be relatively heavily doped relative to the regions 14 and 18 (which are shown to be doped to an n level). Similarly, the region 20 is shown to be doped to a p+ level, and thus is shown to be relatively heavily doped relative to the region 12 (which is shown to be doped to an p level).

The less heavily doped regions 14 and 18 may be provided to grade the junctions between the heavily-doped n-type region 16 and the p-type doped regions 12 and 20, and thereby alleviate or prevent leakage which may otherwise occur.

The regions 14, 16, 18 and 20 may be formed to any suitable thicknesses. In the shown embodiment, the heavily doped n-type region 16 is at least about twice as thick as the less heavily doped n-type regions 14 and 18. In other embodiments, the relative thickness of region 16 to regions 14 and 18 may be different.

The various dopant levels and types of the regions 12, 14, 16, 18 and 20 may be maintained so long as dopant does not out-diffuse from the various regions to create intermixing of dopant between the regions. In some embodiments, out-diffusion may be substantially prevented by avoiding exposure of the regions 12, 14, 16, 18 and 20 to temperatures in excess of about 600° C. In some embodiments, intermixing of dopant between adjacent regions may be substantially prevented by providing barriers along interfaces between such regions. For instance, carbon may be implanted along interfaces between region 16 and the adjacent regions 14 and 18 to form carbon-containing barrier material along such interfaces. Such barrier material can restrict diffusion of dopant across the interfaces. Carbon may also be implanted along an interface between regions 12 and 14 to form carbon-containing barrier material along such interface, and/or along an interface between regions 18 and 20 to form carbon-containing barrier material along such interface.

In some embodiments, the n-type doped regions 14, 16 and 18 may be referred to as first, second and third n-type doped regions, respectively.

The n-type doped regions 14, 16 and 18, together with the p-type doped region 20, form a PN diode which is ultimately a select device for a PCRAM cell. Although it may be advantageous to include the relatively lightly doped n-type regions 14 and 18 in some embodiments; in other embodiments one or both of such layers may be omitted. Also, although the shown diode is a PN diode, in other embodiments other types of diodes may be utilized, such as, for example, PIN diodes, etc.; or other types of select devices may be utilized.

Figure 4:
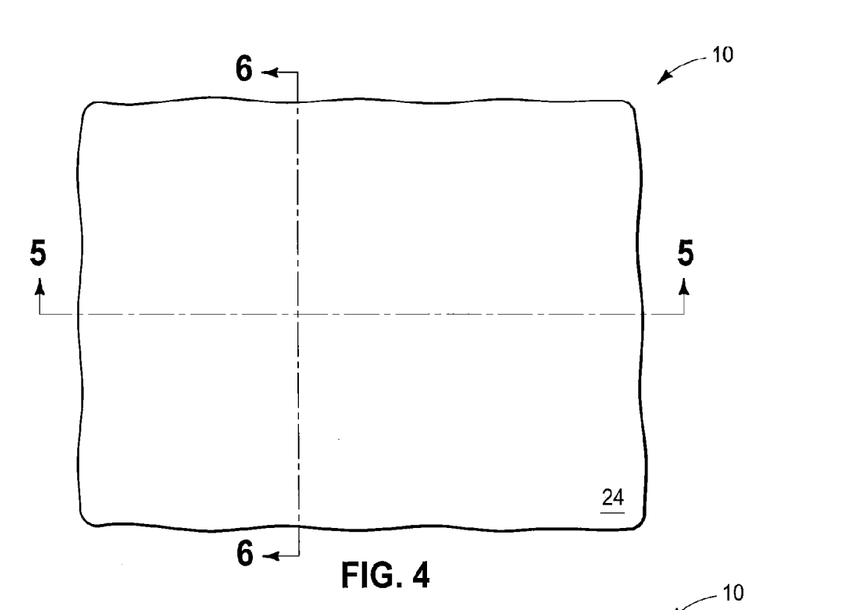
FIGS. 4-6 show a top view (FIG. 4) and cross-sectional side views (FIGS. 5 and 6) of the construction of FIGS. 1-3 at a processing stage subsequent to that of FIGS. 1-3. The cross-section of FIG. 5 is along the lines 5-5 of FIGS. 4 and 6, and the cross-section of FIG. 6 is along the lines 6-6 of FIGS. 4 and 5.
Figure 5:
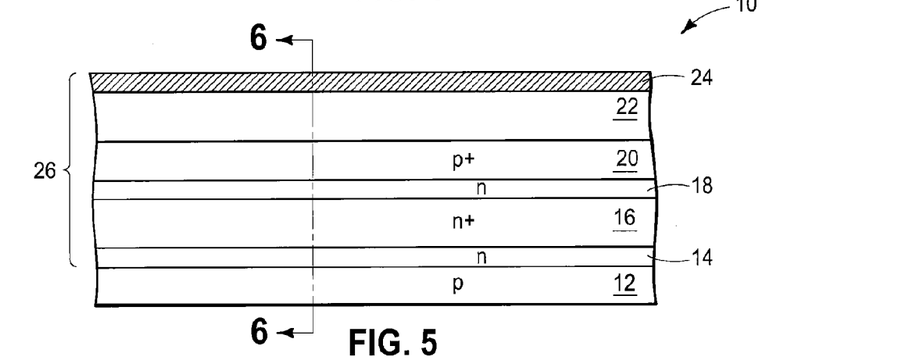
Figure 6:
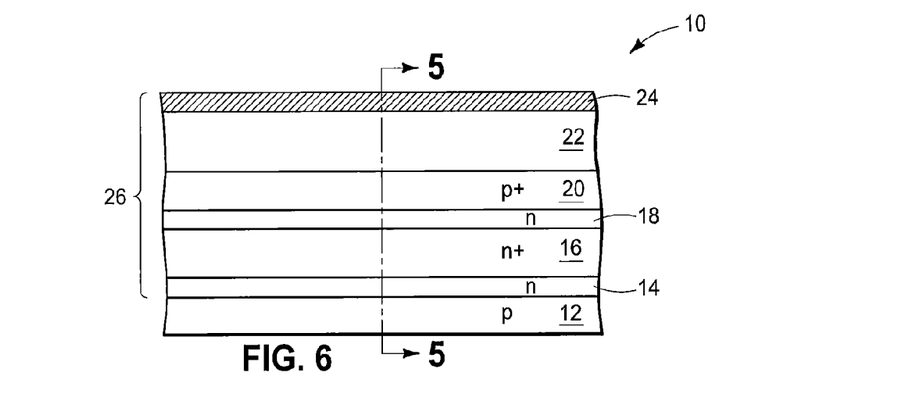

Referring to FIGS. 4-6, ovonic material 22 is deposited over p-type doped region 20, and electrically conductive capping material 24 is deposited across the ovonic material.

In the shown embodiment, the ovonic material 22 is deposited directly onto an upper surface of p-type doped region 20. Thus, PCRAM cells formed from construction 10 (with example cells being shown in FIGS. 19-21) will be so-called heaterless cells. In other embodiments, heater material (for instance, material comprising titanium, silicon and nitrogen) may be provided between the ovonic material 22 and the p-type doped region 20, as described below with reference to an example memory cell in FIG. 22.

The ovonic material may comprise any suitable composition, and in some embodiments may comprise a chalcogenide. An example chalcogenide comprises, consists essentially of, or consists of germanium, antimony and tellurium, and may be referred to as GST. In some embodiments, the chalcogenide may correspond to $Ge_2Sb_2Te_5$. The ovonic material may be formed utilizing any suitable processing, including, for example, one or more of atomic layer deposition (ALD), chemical vapor deposition (CVD) and physical vapor deposition (PVD). GST may be tailored for incorporation into heaterless cells by modifying the stoichiometry of the GST from the conventional stoichiometry of $Ge_2Sb_2Te_5$, and/or by incorporating one or more suitable dopants into the GST. Example dopants are nitrogen and carbon. The total concentration of dopant within the GST may be within a range of from about 2 atomic percent to about 10 atomic percent.

The electrically conductive capping material 24 protects an outer surface of ovonic material 22 in subsequent processing.

The electrically conductive capping material may comprise any suitable composition or combination of compositions, and in some embodiments may comprise one or both of titanium nitride and amorphous carbon. The electrically conductive capping material may be formed by any suitable method, including, for example, one or more of ALD, CVD and PVD. In some embodiments (not shown) the capping material 24 may be omitted.

In the shown embodiment, the electrically conductive capping material 24 is directly against an upper surface of ovonic material 22.

The regions 14, 16, 18 and 20, together with the materials 22 and 24, form a stack 26. In some embodiments, the heavily n-type doped region 16 and the heavily p-type doped region 20 may be considered to be electrically conductive expanses, or regions, of the stack 26.

Figure 7:
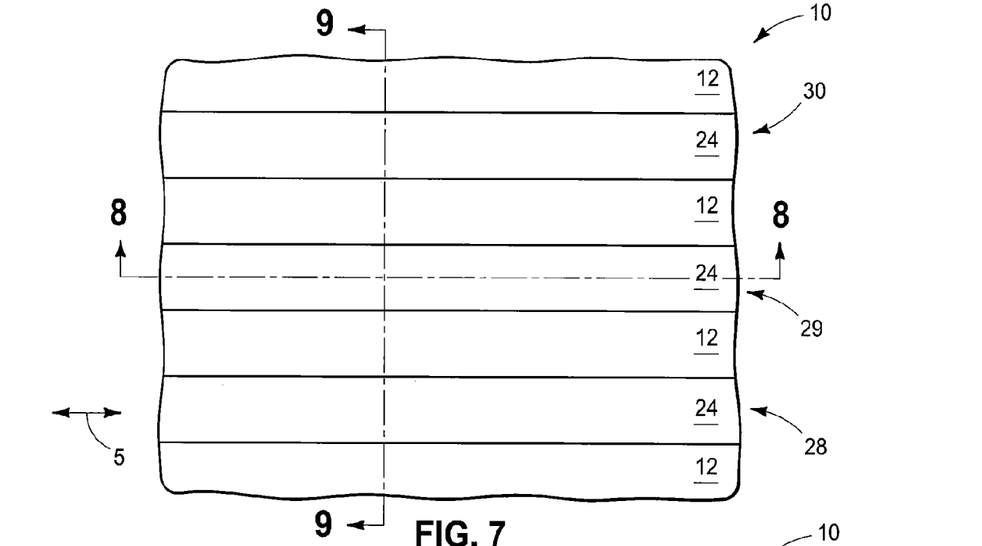
FIGS. 7-9 show a top view (FIG. 7) and cross-sectional side views (FIGS. 8 and 9) of the construction of FIGS. 1-3 at a processing stage subsequent to that of FIGS. 4-6. The cross-section of FIG. 8 is along the lines 8-8 of FIGS. 7 and 9, and the cross-section of FIG. 9 is along the lines 9-9 of FIGS. 7 and 8.
Figure 8:
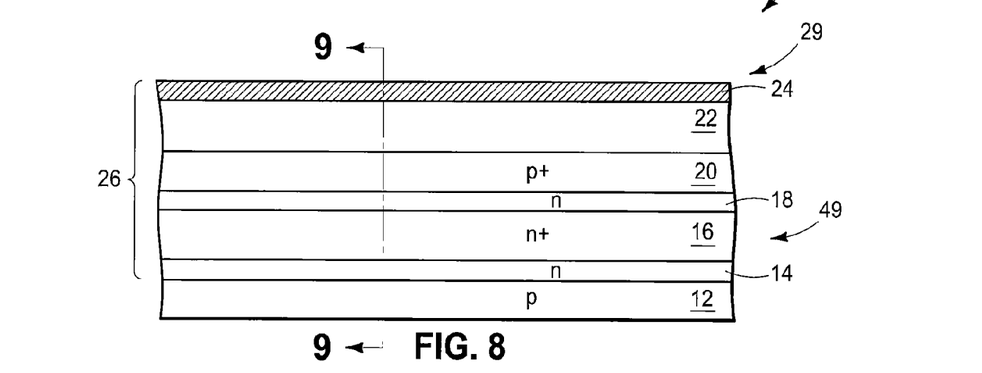
Figure 9:
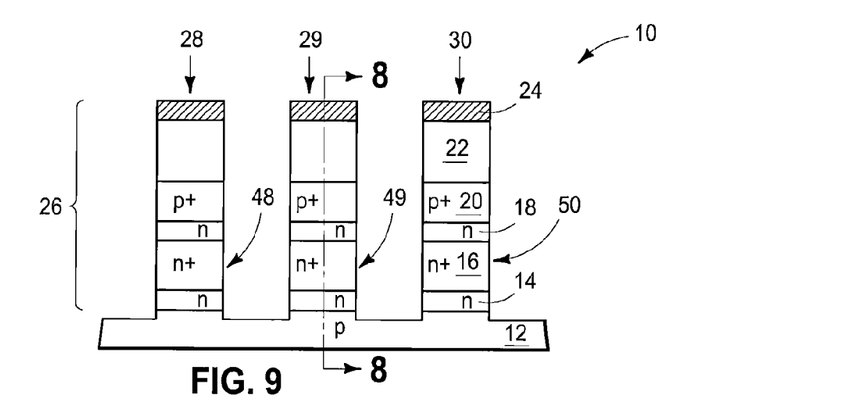

Referring to FIGS. 7-9, the stack 26 is patterned into a plurality of rails 28-30. The rails are elongated along a direction of an illustrated axis 5 in the shown embodiment, and such axis may be referred to as a first axis. Although the rails are substantially straight in the shown embodiment, in other embodiments the rails may be curved or wavy. Even if the rails are curved or wavy, such rails may extend primarily along the illustrated axis 5 in some embodiments.

The stack 26 may be patterned into the rails 28-30 with any suitable processing. For instance, a patterned mask (not shown) may be formed over stack 26 to define locations of the rails 28-30, a pattern may be transferred from the mask into stack 26 with one or more suitable etches, and then the mask may be removed. The mask may comprise any suitable composition or combination of compositions. For instance, the mask may comprise photolithographically-patterned photoresist. As another example, the mask may comprise one or more materials patterned utilizing pitch-multiplication methodologies.

The etching utilized to form the rails 28-30 comprises one or more etches which penetrate entirely through materials 22 and 24, as well as entirely through doped regions 14, 16, 18 and 20. In the shown embodiment, the etching utilized to form the rails 28-30 also penetrates into, but not entirely through, the p-type doped region 12.

The patterning of conductive region 16 into the rails 28-30 may be considered to form the conductive region 16 into a plurality of conductive lines 48-50 contained within the rails 28-30, respectively.

Figure 10:
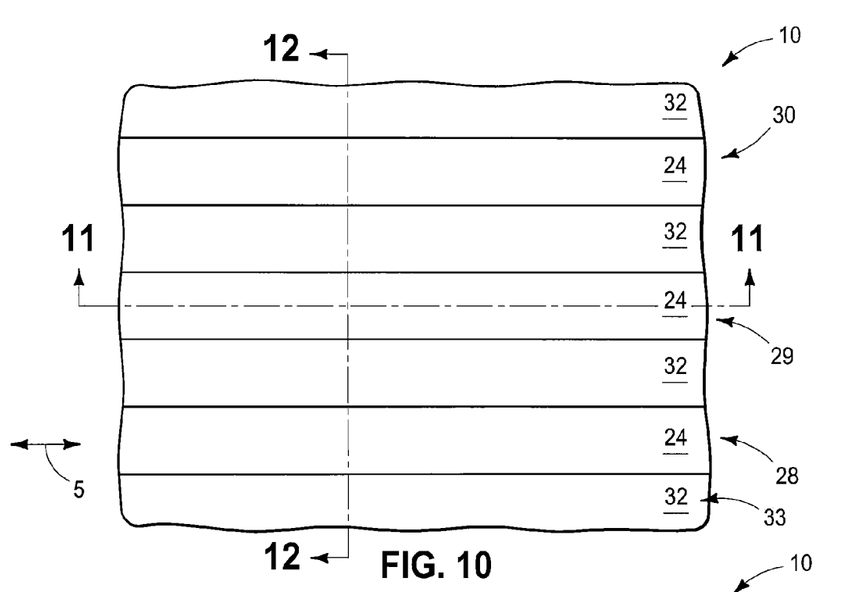
FIGS. 10-12 show a top view (FIG. 10) and cross-sectional side views (FIGS. 11 and 12) of the construction of FIGS. 1-3 at a processing stage subsequent to that of FIGS. 7-9. The cross-section of FIG. 11 is along the lines 11-11 of FIGS. 10 and 12, and the cross-section of FIG. 12 is along the lines 12-12 of FIGS. 10 and 11.
Figure 11:
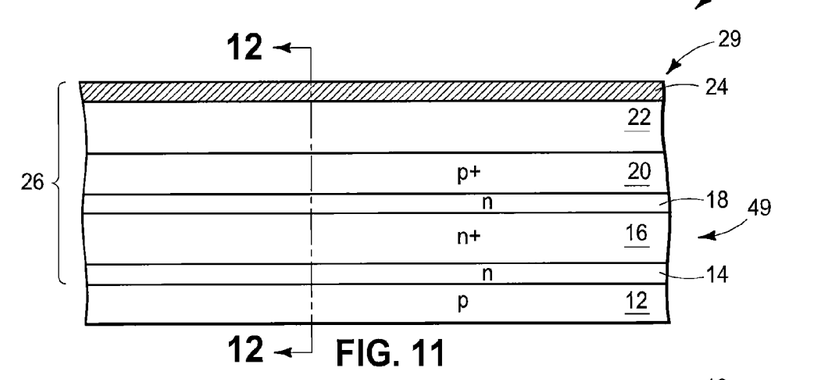
Figure 12:
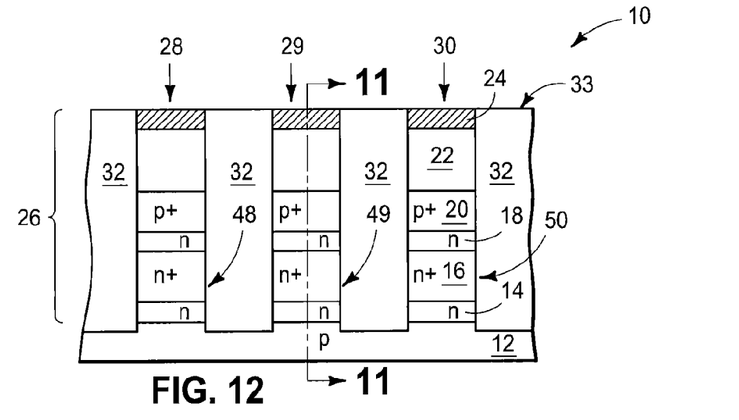

Referring to FIGS. 10-12, electrically insulative material 32 is formed between the rails 28-30. The electrically insulative material may comprise any suitable composition or combination of compositions; and in some embodiments may comprise one or more of silicon dioxide, silicon nitride, and any of various doped silicate glasses (for instance, borophosphosilicate glass, phosphosilicate glass, fluorosilicate glass, etc.).

The electrically insulative material 32 may be formed with any suitable processing, including, for example, one or both of ALD and CVD. In some embodiments, the electrically insulative material may be formed to fill spaces between the rails 28-30, and to extend across upper surfaces of such rails. Subsequently, chemical-mechanical polishing (CMP) and/or other planarization may be utilized to form the illustrated planarized upper surface 33 extending across insulative material 32 and rails 28-30.

Figure 13:
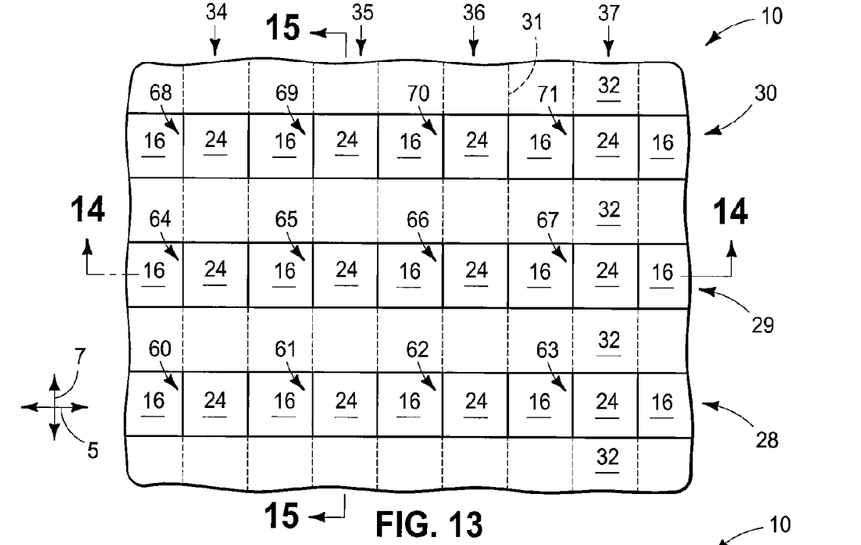
FIGS. 13-15 show a top view (FIG. 13) and cross-sectional side views (FIGS. 14 and 15) of the construction of FIGS. 1-3 at a processing stage subsequent to that of FIGS. 10-12. The cross-section of FIG. 14 is along the lines 14-14 of FIGS. 13 and 15, and the cross-section of FIG. 15 is along the lines 15-15 of FIGS. 13 and 14.
Figure 14:
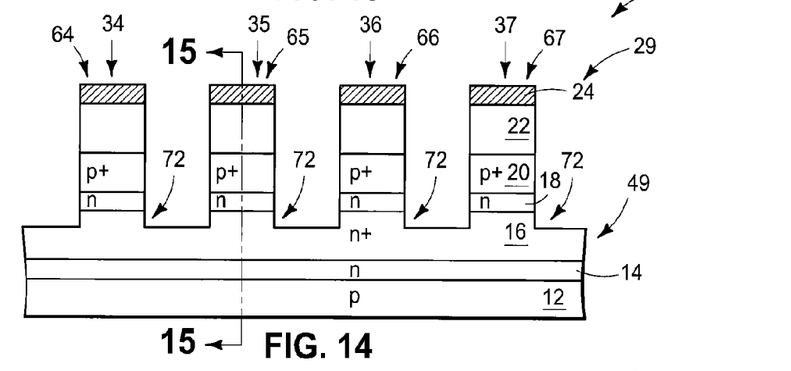
Figure 15:
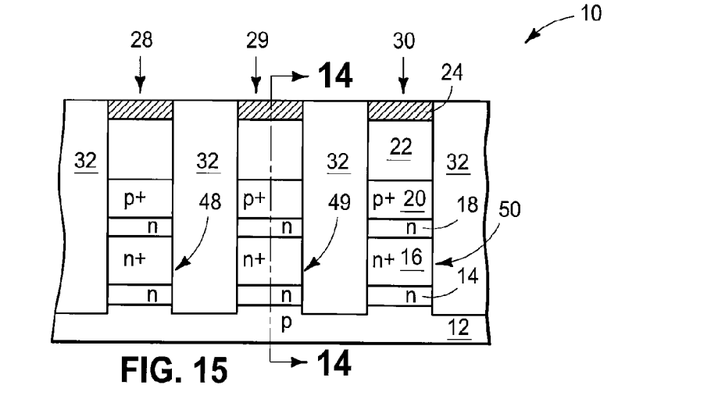

Referring to FIGS. 13-15, the rails 28-30 and insulative material 32 are patterned into a plurality of lines 34-37 that extend substantially orthogonally to the rails 28-30. Specifically, the lines 34-37 are elongated along an axis 7, and the rails 28-30 are elongated along the axis 5 which is substantially orthogonal to the axis 7. The term "substantially orthogonal" is utilized to indicate that the two axes are orthogonal within reasonable tolerances of design and measurement.

The lines 34-37 may be formed with any suitable processing. For instance, a patterned mask (not shown) may be formed over the planarized upper surface 33 (FIG. 10) to define locations of the lines 34-37, a pattern may be transferred from the mask into underlying materials and regions with one or more suitable etches, and then the mask may be removed. The mask may comprise any suitable composition or combination of compositions. For instance, the mask may comprise photolithographically-patterned photoresist. As another example, the mask may comprise one or more materials patterned utilizing pitch-multiplication methodologies.

The formation of lines 34-37 patterns regions 18 and 20 and materials 22 and 24 of rails 28-30 into pillars 60-71. In the shown embodiment, the etch utilized to form the pillars 60-71 extends partially into heavily n-type doped regions 16, and thus forms portions of such n-type doped regions into segments within the pillars. Such segments may be referred to as mesas 72 of the heavily n-type doped regions 16 (shown in FIG. 14). The etching utilized to form the pillars 60-71 thus subdivides heavily n-type regions 16 into portions corresponding to conductive lines 48-50, and other portions corresponding to the mesas 72 within the pillars 60-71.

Each of the pillars 60-71 ultimately comprises a single memory cell of a memory array. Specifically, the patterning of the pillars 60-71 patterns the ovonic material 22 into a plurality of memory cells.

The conductive lines 48-50 (i.e., the lines formed from heavily-doped n-type region 16) may be considered to interconnect various of the pillars 60-71 along the direction of axis 5, and thus to form interconnects along rows or columns of the memory array. Ultimately, such conductive lines may be utilized as access/sense lines (for instance, wordlines) of the memory array.

The etching utilized to form the pillars 60-71 comprises one or more etches which penetrate entirely through materials 22 and 24, as well as entirely through doped regions 18 and 20, and partially through n-type doped region 16. In the shown embodiment, the etching utilized to form the pillars 60-71 also penetrates into electrically insulative material 32; and thus forms the lines 34-37. A height of material 32 is reduced in spaces between lines 34-37 due to the etching of material 32, but in the shown embodiment the material 32 is not entirely removed from within such spaces. Dashed lines 31 are provided to diagrammatically illustrate boundaries where tall regions of insulative material 32 within the lines 34-37 join to short regions of material 32 between the lines. In other embodiments, material 32 may be entirely removed from within the spaces between the lines 34-37. In yet other embodiments, the etch utilized to form the pillars 60-71 may be selective relative to material 32 so that material 32 is not patterned into the lines 34-37. Accordingly, in some embodiments little or none of material 32 may be removed during the formation of the pillars 60-71.

Figure 16:
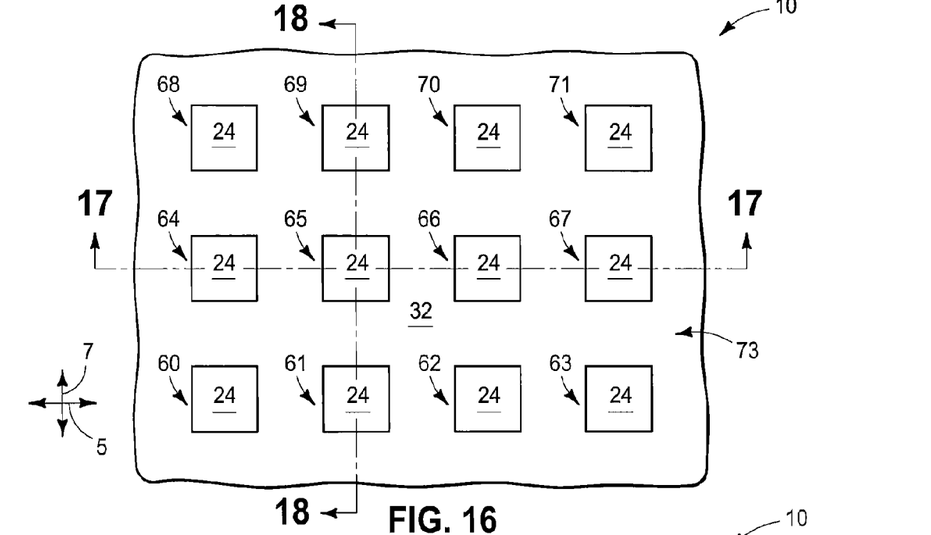
FIGS. 16-18 show a top view (FIG. 16) and cross-sectional side views (FIGS. 17 and 18) of the construction of FIGS. 1-3 at a processing stage subsequent to that of FIGS. 13-15. The cross-section of FIG. 17 is along the lines 17-17 of FIGS. 16 and 18, and the cross-section of FIG. 18 is along the lines 18-18 of FIGS. 16 and 17.
Figure 17:
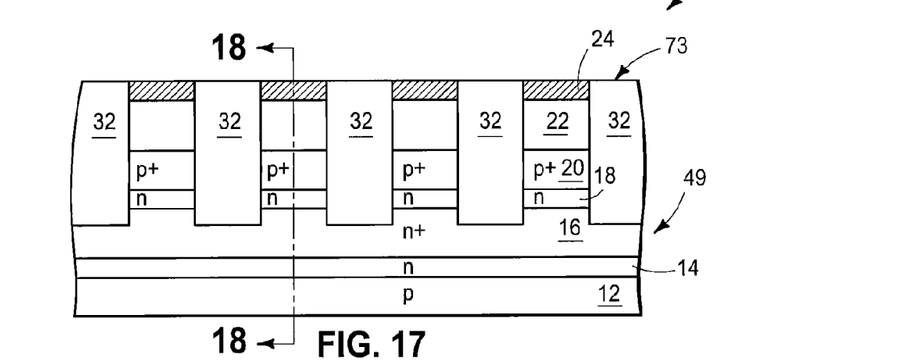
Figure 18:
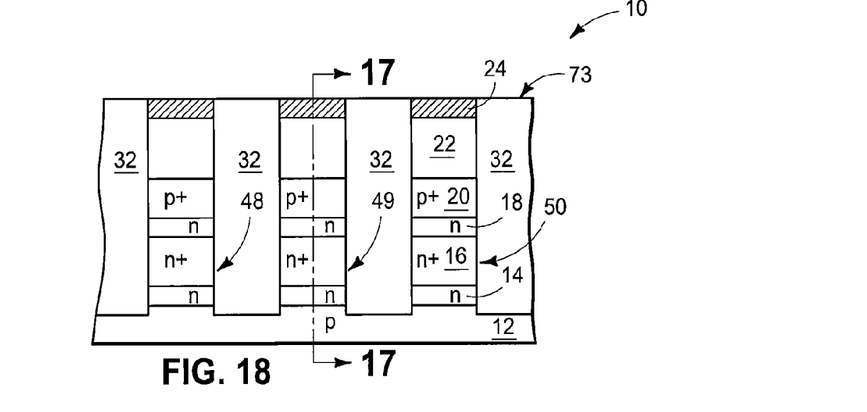

Referring to FIGS. 16-18, additional electrically insulative material 32 is formed between the pillars 60-71. Although the shown embodiment uses the same electrically insulative material 32 to fill in between the pillars 60-71 as was used at the processing stage of FIGS. 10-12 to fill in between the rails, in other embodiments a different electrically insulative material may be used to fill in between the pillars. In the shown embodiment, CMP and/or other planarization has been utilized to form the illustrated planarized upper surface 73 extending across insulative material 32 and the pillars 60-71.

Figure 19:
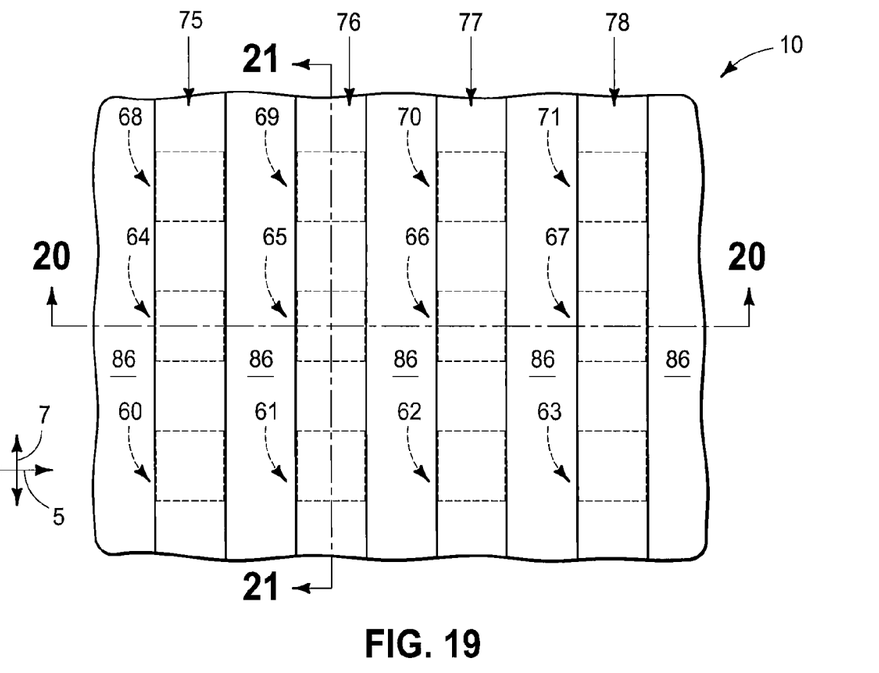
FIGS. 19-21 show a top view (FIG. 19) and cross-sectional side views (FIGS. 20 and 21) of the construction of FIGS. 1-3 at a processing stage subsequent to that of FIGS. 16-18. The cross-section of FIG. 20 is along the lines 20-20 of FIGS. 19 and 21, and the cross-section of FIG. 21 is along the lines 21-21 of FIGS. 19 and 20.
Figure 20:
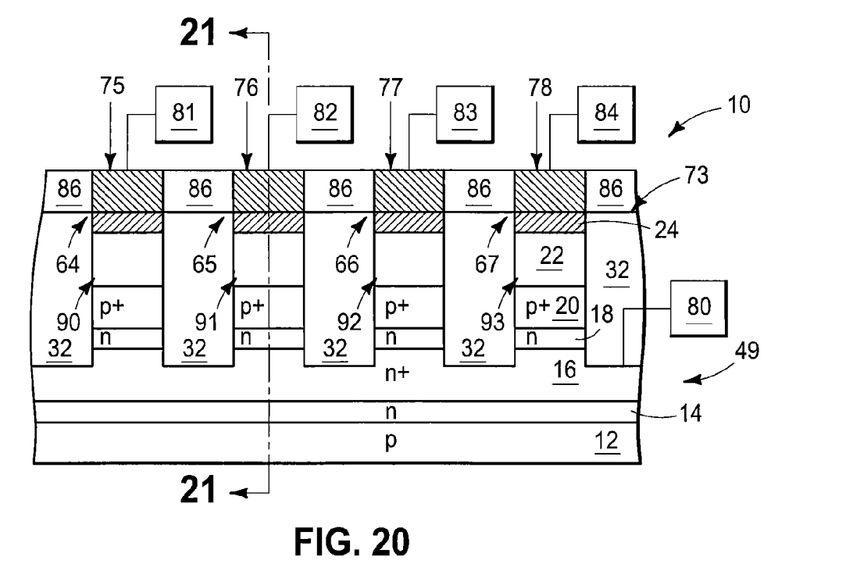
Figure 21:
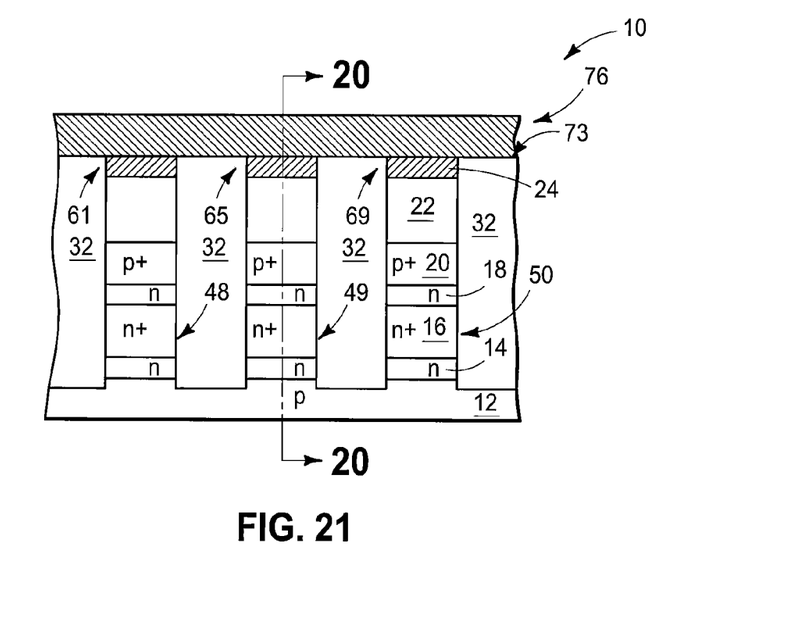

Referring to FIGS. 19-21, electrically conductive lines 75-78 are formed across the pillars 60-71 (with such pillars being shown with dashed-lines in the top view of FIG. 19 to indicate that the pillars are beneath the conductive lines 75-78). The lines 75-78 may be referred to as second electrically conductive lines to distinguish them from the first electrically conductive lines 48-50 formed from n-type doped region 16. The second electrically conductive lines cross the first electrically conductive lines. In the shown embodiment, the second electrically conductive lines 75-78 extend substantially orthogonally relative to the first electrically conductive lines 48-50.

The second electrically conductive lines 75-78 may comprise any suitable electrically conductive composition or combination of compositions. In some embodiments, such electrically conductive lines may comprise one or more of various metals, such as, for example, copper, titanium, ruthenium, platinum, etc. For instance, in some embodiments, the lines may comprise copper-containing material surrounded by copper barrier material (for instance, ruthenium-comprising material). In some embodiments, the conductive lines 75-78 may comprise metal silicide (for instance cobalt silicide).

The first electrically conductive lines 48-50 interconnect pillars 60-71 along one direction of a memory array, and the second electrically conductive lines 75-78 interconnect the pillars along a different direction of the memory array. Each of the pillars comprises a memory cell of the memory array, and each memory cell may be uniquely addressed through the combination of one of the second electrically conductive lines and one of the first electrically conductive lines. In some embodiments, the first electrically conductive lines may be wordlines extending along rows of the array, and the second electrically conductive lines may be bitlines extending along columns of the array.

FIG. 20 shows pillars 65-67 containing memory cells 90-93. Each memory cell comprises ovonic material 22 between the electrically conductive p-type doped region 20 and the electrically conductive capping material 24. The p-type doped region and the capping material may be considered to be first and second electrodes on opposing sides of the ovonic material of the memory cells.

FIG. 20 diagrammatically illustrates the first electrically conductive line 49 connected with circuitry 80; and diagrammatically illustrates the second electrically conductive lines 75-78 connected with circuitry 81-84, respectively. The circuitry represented as 80-84 may be utilized for providing appropriate electrical input to the individual memory cells 90-93 during programming of the memory cells and/or reading of the memory cells.

FIGS. 19-21 illustrate a portion of an example embodiment memory array. Such memory array may have any suitable number of memory cells; and in some embodiments may have hundreds, thousands, tens of thousands, millions, billions, etc., memory cells.

The shown embodiment has electrically insulative material 86 provided between the conductive lines 75-78. Such electrically insulative material may comprise any suitable composition or combination of compositions, including, for example, one or more of the compositions discussed above with reference to insulative material 32. In some embodiments, insulative materials 32 and 86 may be the same composition as one another, and in other embodiments the insulative materials may be different compositions relative to one another.

Although the electrically conductive lines 75-78 are shown formed at a processing stage subsequent to the etch utilized to form the pillars 60-71 (i.e., the etch described above with reference to FIGS. 13-15), in other embodiments the lines may be provided prior to such etch. In such other embodiments, the lines may be utilized as a mask during the etch utilized to form the pillars. In yet other embodiments, conductive material of the lines may be formed across the planarized upper surface 33 at a processing stage subsequent to that of FIG. 12, and then such conductive material may be patterned into lines 75-78 simultaneously with the etching described above with reference to FIGS. 13-15 for forming pillars 60-71.

Figure 22:
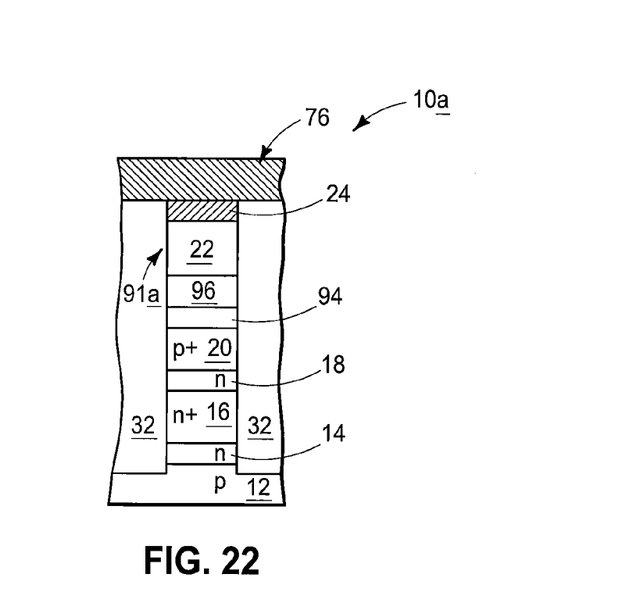
FIG. 22 shows a portion of a construction at a processing stage analogous to the processing stage of FIG. 21, illustrating another example embodiment.

The embodiment of FIGS. 19-21 forms PCRAM cells in which ovonic material 22 is directly against the p-type doped regions 20 of the diodes utilized as select devices. In other embodiments, the ovonic material 22 may not be directly against such p-type doped regions, but instead may be spaced from the p-type doped regions by one or more intervening materials. For instance, FIG. 22 shows a construction 10a at a processing stage analogous to that of FIG. 21, and shows a memory cell 91a having ovonic material 22 spaced from p-type doped region 20 by intervening materials 94 and 96. In some embodiments, the material 96 may be a heater material; and may comprise, for example, titanium, silicon and nitrogen. In such embodiments, the material 94 may be a silicide (for instance, cobalt silicide), and may be utilized to improve adhesion between the heater material 96 and the p-type doped region 20. In other embodiments, heater material 96 may be utilized without the silicide 94.

The embodiments discussed above with reference to FIGS. 1-22 may be conducted with any suitable thermal processing. In some embodiments, it may be desired to avoid heating the ovonic material 22 to above 400° C. after formation of the ovonic material in order to avoid thermal degradation of such material.

The memory devices and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming a plurality of memory cells. A stack is formed to comprise ovonic material over an electrically conductive region. The stack is patterned into rails, with the rails extending along a first direction. The rails are patterned into pillars. The patterning into the pillars comprises etching into but not entirely through the electrically conductive region to form a portion of the electrically conductive region into segments within the pillars, and to leave some of the electrically conductive region as first conductive lines interconnecting the pillars along the first direction. Second electrically conductive lines are formed over the ovonic material, with the second electrically conductive lines extending along a second direction that intersects the first direction. The second electrically conductive lines interconnect the pillars along the second direction.

Some embodiments include a method of forming a plurality of memory cells. A stack is formed over a semiconductor base. The stack comprises an n-type doped region, a p-type doped region, and an ovonic material over the p-type doped region. The stack is patterned into rails, with the rails extending along a first direction. The rails are patterned into pillars. The patterning into the pillars comprises etching into but not entirely through the n-type doped region to form a portion of the n-type doped region into segments within the pillars, and to leave some of the n-type doped region as first conductive lines interconnecting the pillars along the first direction. Second electrically conductive lines are formed over the ovonic material, with the second electrically conductive lines extending along a second direction that intersects the first direction. The second electrically conductive lines interconnect the pillars along the second direction.

Some embodiments include a method of forming a plurality of memory cells. A first n-type doped region is formed over a semiconductor base. A second n-type doped region is formed over the first n-type doped region. A third n-type doped region is formed over the second n-type doped region. The second n-type doped region is more heavily doped than the first and third n-type doped regions. A p-type doped region is formed over the third n-type doped region. An ovonic material is formed over the p-type doped region. Electrically conductive capping material is formed over the ovonic material. The first, second and third n-type doped regions, the p-type doped region, the ovonic material and the electrically conductive capping material are patterned into rails extending along a first direction. The rails are patterned into pillars. The patterning into the pillars comprises etching into but not entirely through the second n-type doped conductive region to form a portion of the second n-type doped region into segments within the pillars, and to leave some of the second n-type doped region as first conductive lines interconnecting the pillars along the first direction. Second electrically conductive lines are formed over the capping material, with the second electrically conductive lines extending along a second direction that intersects the first direction. The second electrically conductive lines interconnect the pillars along the second direction.

Some embodiments include a memory array. The array includes first electrically conductive lines. The first electrically conductive lines are n-type doped regions of semiconductor material and extend along a first direction. Pillars are over the first conductive lines. The pillars comprise mesas of the n-type doped regions of the semiconductor material extending upwardly from the electrically conductive lines, comprise p-type doped regions of the semiconductor material over the mesas, and comprise ovonic material over and directly against the p-type doped regions. Second electrically conductive lines are over the ovonic material. The second electrically conductive lines extend along a second direction that intersects the first direction. The second electrically conductive lines interconnect the pillars along the second direction.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a plurality of memory cells, comprising:
    forming a stack comprising ovonic material over a homogeneous electrically conductive material;
    patterning the stack into rails, with the rails extending along a first direction;
    patterning the rails into pillars, the patterning into the pillars comprising etching into but not entirely through the homogeneous electrically conductive material to form a portion of the homogeneous electrically conductive material into segments within the pillars, and to leave some of the homogeneous electrically conductive material as first conductive lines interconnecting the pillars along the first direction; and
    forming second electrically conductive lines over the ovonic material, with the second electrically conductive lines extending along a second direction that intersects the first direction; the second electrically conductive lines interconnecting the pillars along the second direction.

2. The method of claim 1 wherein the ovonic material comprises germanium, antimony and tellurium.

3. The method of claim 1 wherein the ovonic material includes dopant comprising one or both of carbon and nitrogen, with the dopant being present to a concentration of less than or equal to about 10 atomic percent.

4. The method of claim 1 wherein:
    the homogeneous electrically conductive material is n-type doped semiconductor material; and
    the stack comprises p-type doped semiconductor material over the n-type doped semiconductor material.

5. The method of claim 4 wherein the ovonic material is directly against the p-type doped semiconductor material.

6. The method of claim 4 wherein the stack comprises one or more materials between the ovonic material and the p-type doped semiconductor material.

7. The method of claim 6 wherein the one or more materials include a heater material directly against the ovonic material, with the heater material comprising titanium, silicon and nitrogen.

8. The method of claim 7 wherein the one or more materials include a silicide between the heater material and the p-type doped semiconductor material.

9. A method of forming a plurality of memory cells, comprising:
    forming a stack over a semiconductor base; the stack comprising a homogeneous n-type doped region, a p-type doped region, and an ovonic material over the p-type doped region;
    patterning the stack into rails, with the rails extending along a first direction;
    patterning the rails into pillars, the patterning into the pillars comprising etching into but not entirely through the homogeneous n-type doped region to form a portion of the homogeneous n-type doped region into segments within the pillars, and to leave some of the homogeneous n-type doped region as first conductive lines interconnecting the pillars along the first direction; and forming second electrically conductive lines over the ovonic material, with the second electrically conductive lines extending along a second direction that intersects the first direction; the second electrically conductive lines interconnecting the pillars along the second direction.

10. The method of claim 9 wherein the ovonic material is directly against the p-type doped region.

11. The method of claim 9 wherein the ovonic material is not directly against the p-type doped region.

12. The method of claim 9 wherein the homogeneous n-type doped region is a first n-type doped region and comprises a first dopant concentration; and wherein the stack further comprises a second n-type doped region between the first n-type doped region and the p-type doped region; the second n-type doped region comprising a second dopant concentration which is less than the first dopant concentration.

13. The method of claim 12 wherein the stack further comprises a first barrier between the first and second n-type doped regions, and comprises a second barrier between the second n-type doped region and the p-type doped region.

14. The method of claim 13 wherein the first and second barriers comprise carbon.

15. A method of forming a plurality of memory cells, comprising:

forming a first n-type doped region over a semiconductor base;

forming a second n-type doped region over the first n-type doped region;

forming a third n-type doped region over the second n-type doped region; the second n-type doped region being more heavily doped than the first and third n-type doped regions;

forming a p-type doped region over the third n-type doped region;

forming an ovonic material over the p-type doped region;

forming electrically conductive capping material over the ovonic material;

patterning the first, second and third n-type doped regions, the p-type doped region, the ovonic material and the electrically conductive capping material into rails extending along a first direction;

patterning the rails into pillars, the patterning into the pillars comprising etching into but not entirely through the second n-type doped conductive region to form a portion of the second n-type doped region into segments within the pillars, and to leave some of the second n-type doped region as first conductive lines interconnecting the pillars along the first direction; and forming second electrically conductive lines over the capping material, with the second electrically conductive lines extending along a second direction that intersects the first direction; the second electrically conductive lines interconnecting the pillars along the second direction.

16. The method of claim 15 wherein the second electrically conductive lines are formed during the patterning of the rails into the pillars.

17. The method of claim 15 wherein the second electrically conductive lines are formed prior to the patterning of the rails into the pillars.

18. The method of claim 15 wherein the second electrically conductive lines are formed after the patterning of the rails into the pillars.

19. The method of claim 15 wherein the first n-type doped region is formed over a p-type doped region of the semiconductor base.

20. The method of claim 15 wherein a temperature of the ovonic material does not exceed about 400° C. after formation of the ovonic material.

21. The method of claim 15 wherein the ovonic material is directly against the p-type doped region.

22. The method of claim 15 wherein the ovonic material is not directly against the p-type doped region.

23. A memory array, comprising:

first electrically conductive lines, the first electrically conductive lines being n-type doped regions of semiconductor material and extending along a first direction;

pillars over the first conductive lines; the pillars comprising mesas of the n-type doped regions of the semiconductor material extending upwardly from the electrically conductive lines, comprising p-type doped regions of the semiconductor material over the mesas, and comprising ovonic material over and directly against the p-type doped regions; wherein a common, continuous and homogenous n-type doped semiconductor material comprises both the n-type doped regions of the first electrically conductive lines and the mesas of the n-type doped regions; and second electrically conductive lines over the ovonic material; the second electrically conductive lines extending along a second direction that intersects the first direction; the second electrically conductive lines interconnecting the pillars along the second direction.

24. The memory array of claim 23 further comprising electrically conductive capping material within the pillars and over the ovonic material.

25. The memory array of claim 24 wherein the electrically conductive capping material comprises titanium nitride.

26. A memory array, comprising:

first electrically conductive lines, the first electrically conductive lines being n-type doped regions of semiconductor material and extending along a first direction;

pillars over the first conductive lines; the pillars comprising mesas of the n-type doped regions of the semiconductor material extending upwardly from the electrically conductive lines, comprising p-type doped regions of the semiconductor material over the mesas, and comprising ovonic material over and directly against the p-type doped regions;

second electrically conductive lines over the ovonic material; the second electrically conductive lines extending along a second direction that intersects the first direction; the second electrically conductive lines interconnecting the pillars along the second direction;

electrically conductive capping material within the pillars and over the ovonic material; and wherein the electrically conductive capping material comprises amorphous carbon.

27. The memory array of claim 26 wherein the ovonic material comprises germanium, antimony and tellurium.

28. The memory array of claim 27 wherein the ovonic material includes dopant comprising one or both of carbon and nitrogen, with the dopant being present to a concentration of less than or equal to about 10 atomic percent.

29. The memory array of claim 26 wherein the mesas of the n-type doped regions are heavily n-type doped regions, and wherein the pillars further comprise lightly n-type doped regions over the heavily n-typed doped regions; the lightly n-type doped regions being between the heavily n-type doped regions and the p-type doped regions.

30. A memory array, comprising:
first electrically conductive lines, the first electrically conductive lines being n-type doped regions of semiconductor material and extending along a first direction;
pillars over the first conductive lines; the pillars comprising mesas of the n-type doped regions of the semiconductor material extending upwardly from the electrically conductive lines, comprising p-type doped regions of the semiconductor material over the mesas, and comprising ovonic material over and directly against the p-type doped regions;
second electrically conductive lines over the ovonic material; the second electrically conductive lines extending along a second direction that intersects the first direction; the second electrically conductive lines interconnecting the pillars along the second direction;
wherein the mesas of the n-type doped regions are heavily n-type doped regions, and wherein the pillars further comprise lightly n-type doped regions over the heavily n-typed doped regions; the lightly n-type doped regions being between the heavily n-type doped regions and the p-type doped regions; and
further comprising carbon-containing barrier material between the heavily n-typed doped regions and the lightly n-type doped regions.

31. A memory array, comprising:
first electrically conductive lines, the first electrically conductive lines being n-type doped regions of semiconductor material and extending along a first direction;
pillars over the first conductive lines; the pillars comprising mesas of the n-type doped regions of the semiconductor material extending upwardly from the electrically conductive lines, comprising p-type doped regions of the semiconductor material over the mesas, and comprising ovonic material over and directly against the p-type doped regions;
second electrically conductive lines over the ovonic material; the second electrically conductive lines extending along a second direction that intersects the first direction; the second electrically conductive lines interconnecting the pillars along the second direction;
wherein the mesas of the n-type doped regions are heavily n-type doped regions, and wherein the pillars further comprise lightly n-type doped regions over the heavily n-typed doped regions; the lightly n-type doped regions being between the heavily n-type doped regions and the p-type doped regions; and
further comprising:
carbon-containing barrier material between the heavily n-typed doped regions and the lightly n-type doped regions; and
carbon-containing barrier material between the lightly n-typed doped regions and the p-type doped regions.

* * * * *